TUNNEL DIODE NOR LOGIC CIRCUIT

Filed Feb. 13, 1962 3 Sheets-Sheet 1

INVENTORS
BRIAN ELLIOTT SEAR
JACK SAUL CUBERT
BY G. Donald Weber, Jr.
AGENT

United States Patent Office 3,292,003

Patented Dec. 13, 1966

3,292,003

TUNNEL DIODE NOR LOGIC CIRCUIT

Brian Elliott Scar, Oreland, and Jack Saul Cubert, Willow Grove, Pa., assignors to Sperry Rand Corporation, New York, N.Y., a corporation of Delaware Filed Feb. 13, 1962, Ser. No. 172,937
2 Claims. (Cl. 307—88.5)

This invention relates to diode coupled logic circuits. More particularly, the invention relates to diode coupled tunnel diode NOR logic circuits.

In the past, tunnel diode circuits have been used in logic circuits as well as other switching circuits. Generally, a plurality of these tunnel diode circuits have been coupled together via a coupling impedance. The coupling impedances have been generally of the fixed value type whereby load current and input current were dependent upon the value of the coupling impedance as well as the magnitude of the high state voltage of the preceding stage. Inasmuch as the coupling impedance was substantially constant in value and capable of passing current in either direction the input circuit could present a heavy load on the circuit. Moreover, inasmuch as the high state voltage of a tunnel diode can easily vary by 20% depending upon the output load requirement, the succeeding stage may have different voltages applied thereto for different loading conditions. Clearly, this type of operation is undesirable.

In the instant invention, the tunnel diode circuits are coupled via unilateral conducting devices, for example diodes, whereby an effective open circuit input load (in the idealized condition) is presented to the previous stage. Therefore, the only load current which may flow is M times a constant current where M denotes the number of outputs derived from the preceding stage and the constant current is supplied via a biasing source, and these quantities can be precisely defined. Moreover, the biasing source which provides the constant current includes the clocking arrangement and effectively defines the input current to the circuit. Thus, a tunnel diode is connected to perform a NOR logic function. In this case, the inputs are coupled to one electrode of the tunnel diode via a unilateral conducting device and the outputs are derived from another electrode of the tunnel diode. The respective electrodes of the tunnel diodes are clamped to predetermined potentials in order to maximize the operation of the circuit. Set clock and reset clock signals are supplied to the different electrodes of the tunnel diodes to control the switching thereof. The set clock source supplies a potential in conjunction with other biasing potentials such that the tunnel diode resides in the low voltage operating condition until a set clock signal is supplied whereupon the tunnel diode may or may not switch in accordance with the input signal information supplied thereto. It will be seen, that this circuit configuration permits fairly wide tolerances on $I_P$, $I_B$ and $I_R$ where $I_P$ is the peak current, $I_B$ is the bias current, and $I_R$ is the clock or input current supplied to the tunnel diode.

From the preceding, it will be seen that one object of this invention is to provide a high speed logic circuit using tunnel diodes.

A further object of this invention is to provide a simple, high speed, tunnel diode NOR circuit with wide circuit tolerances on tunnel diode parameters and associated circuitry.

Another object of this invention is to provide a tunnel diode logic circuit which can be used as an inverter circuit in conjunction with threshold logic and in logic where clocking signals are based on logical decisions.

Another object of this invention is to provide tunnel diode logic circuits which have good input-output isolation whereby a large fan-in is permitted.

Another object of this invention is to provide a tunnel diode logic circuit wherein fan-out is not restricted by variation in the tunnel diode high state voltage.

These and other objects and advantages of this invention will become more readily apparent subsequent to a review of the following description in conjunction with the drawings attached hereto in which.

Figure 1A:
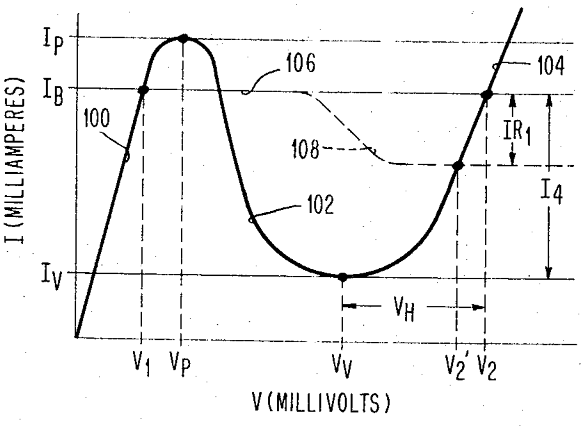
FIGURES 1A through 1C represent typical V–I characteristics for the non-linear components utilized in said circuits.

Referring to FIGURE 1A, there is shown a typical V–I characteristic for a tunnel diode such as may be used in the circuit of the instant invention. This characteristic is of the conventional well-known type of characteristic and includes the low voltage operating condition 100, the high voltage operating state 104, and the negative resistance region 102. The peak current is designated by the reference $I_P$ and the valley current is designated by the reference $I_V$. Similarly, the peak voltage is designated by reference $V_P$ and the valley voltage is designated by the reference $V_V$. These references are well known in tunnel diode art. Normally, a tunnel diode is biased to a particular operating condition. This is represented by the steady state load line designated by the reference $I_B$. Depending upon the type of operation of the circuit in which the tunnel diode is connected, the bias load line 106 may be nearer to $I_P$ than to $I_V$ or vice versa. In a typical application, the load line $I_B$ may have a value on the order of 0.7 $I_P$. The load line 106 is the load line when the circuit is the steady state operating condition and in the no-load condition. When an output load is connected to the tunnel diode, the load line shifts as is graphically represented by dotted load line 108. This shift in load lines is produced inasmuch as the load current designated as $I_{R1}$ is drawn by the load. This current is not identical to the bias current $I_B$. The voltage supplied by the tunnel diode when operating in the high voltage operating condition shifts from $V_2$ to $V_2'$, when load current is drawn. Thus, the potential at the output of the tunnel diode circuit may be varied. This variation may be termed the $\Delta V_H$ where $V_H$ is defined as the difference between the $V_V$ and $V_2$. Inasmuch as $\Delta V_H$ varies as shown, it is desirable to minimize the number of extraneous loads which drain current from the tunnel diode circuit. Consequently, the circuit of the instant invention has been devised to avoid this problem.

Figure 1B:
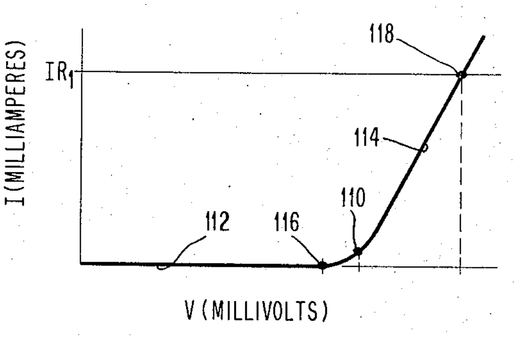

Referring now to FIGURE 1B there is shown a typical V–I characteristic for a diode which may be used in the circuit. The V–I characteristic for a diode is well-known in the art. Thus, there is the low conduction region 112 and the high conduction region 114 which are effectively joined at the break-point 110. Thus, when the diode is biased below the break-point 110, as for example at operating point 116, little or no current flows therethrough; on the contrary, when the diode is biased at operating point 118, a substantial amount of current may be passed through the diode. Also shown in FIGURE 1B, is the particular designation of the current $I_{R1}$. This current was shown in FIGURE 1A to be the load current required from the tunnel diode circuit to be supplied to a single load. Further load current requirements may be understood to be represented by load lines (not shown) between load line 108 and line $I_V$. Clearly, this current requires that the diode be biased to the high conducting region with a potential $V_2$ thereacross whereby the diode operates at operating point 118.

Figure 1C:
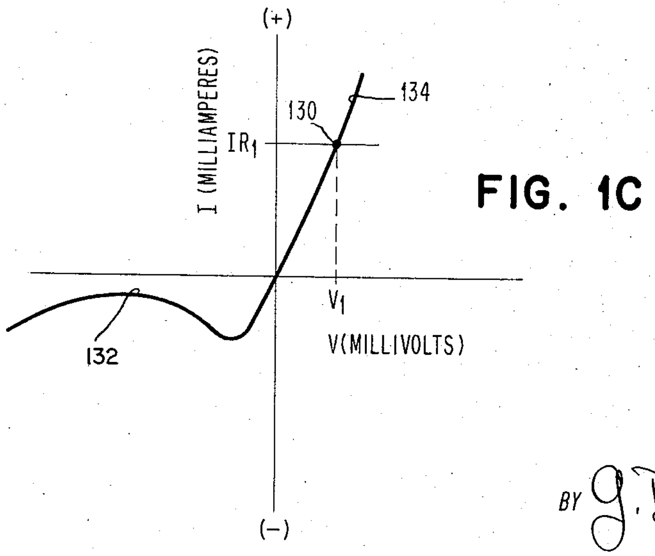

Referring now to FIGURE 1C, there is shown a typical V–I characteristic for a backward diode. Backward diodes are not necessarily as well known in the art as the conventional diode or the tunnel diode. However, a description thereof may be found in "Tunnel Diode Manual" which is made available by General Electric Company. Briefly, the backward diode may be considered to be a tunnel diode which is connected to the circuit in the reverse direction whereby a large current flows and increases continuously as the voltage thereacross increases. That is, a backward diode has a lower forward voltage drop at a given current than a conventional diode. Moreover, a backward diode may be considered to be a very low impedance circuit. The characteristic shown in FIGURE 1C may be considered as being a tunnel diode characteristic which has been rotated 180°. That is, the V–1 characteristic shown in FIGURE 1A has been switched to the third quadrant and the reverse characteristics of the tunnel diode which accompany the characteristics shown in FIGURE 1A (but which reverse characteristics are not shown) is switched to the first quadrant. Thus, the tunnel diode characteristic is shown generally as line portion 132 in FIGURE 1C and the reverse characteristic is shown generally as line 134 in FIGURE 1C. However, the so-called reverse region 134 is now the forward characteristic inasmuch as the backward diode is connected into the circuit in prescribed polarity. The operating point 130 is the point where the backward diode operates when a current $I_{R1}$ is supplied thereto.

Figure 2:
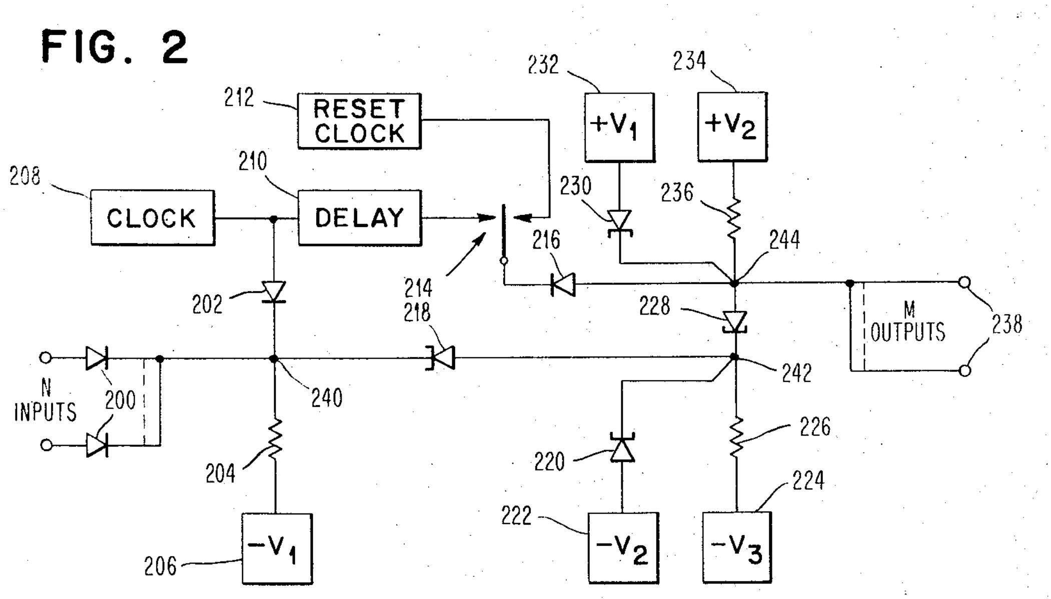
FIGURE 2 is a schematic drawing of one embodiment of this invention.

Referring now to FIGURE 2 there is shown a schematic diagram of one embodiment of the invention. It is to be understood that in the description of the circuit and its operation (including all embodiments) the potentials recited are all relative to ground potential. A diode cluster comprising a plurality of diodes 200 are connected to the circuit to provide means for supplying input signals. These diodes which may be Qutronics type ID5050 diodes are connected together for example in the configuration of an AND gate. The number of input diodes is not specified and it is to be understood that the designation of N inputs does not limit the number of inputs to the two diodes as shown. Moreover, the input diodes are so poled that the anode thereof is connected to the input and the cathodes thereof are connected to the circuit whereby the diodes are forward biased when a high level input signal is applied thereto by the input source. The cathodes of the input diodes are connected to the common junction 240. One terminal of a resistor 204 (1500 ohms) is connected to the common junction and another terminal of the resistor is connected to a potential source 206 which supplies a potential of about −10 volts. The cathode of diode 202 is also connected to common junction 240. The anode of the diode 202, which may also be a Qutronics type diode, is connected to the clock source 208 and the delay line 210. The diode 202 is so poled that the diode is back biased only when the negative going clock signal is applied thereto. The clock source 208 may be any conventional clock source which produces a substantially constant positive base potential of about +500 millivolts and a periodic negative signal of about −500 millivolts which signal is supplied at predetermined intervals in accordance with the desired speed of operation of the circuit. The delay line 210 may be any conventional type of delay line as for example a transmission line and is utilized to delay the clock signals for a predetermined time duration. In one arrangement, the delay line may be utilized to supply the reset signals as will be discussed subsequently.

Also connected to the common junction 240 is the cathode of the backward diode 218. Diode 218 may be a GE type ZJ722 diode which has the V–I characteristic discussed supra. The anode of backward diode 218 is connected to common junction 242. One terminal of the resistor 226 (700 ohms) is connected to the common junction 242. Another terminal of the resistor is connected to the negative potential source 224 which supplies approximately −10 volts. This potential source and resistor combination provides a substantially constant current source to the tunnel diode 228. The cathode of backward diode 220 is connected to the common junction 242. The anode of the backward diode 220 is connected to negative potential source 222 which supplies approximately −100 millivolts. This potential source and backward diode network provides a clamping circuit for the tunnel diode 228. The cathode of tunnel diode 228 which may be for example an RCA type 1N3129 tunnel diode, is connected to common junction 242. The anode of the tunnel diode is connected to the common junction 244. Also connected to the common junction 244 are the output terminals 238. The designation of M outputs is indicative of the fact that the number of outputs are not limited to the two shown. It will be clear that in the configuration shown, the input signals applied to the circuit are connected to the cathode of the tunnel diode 228 and the outputs derived from the circuit are obtained from the anode of the tunnel diode 228 or vice versa.

A resistor 236 (700 ohms) has one terminal thereof connected to the common junction 244 (which is also the anode of tunnel diode 228). Another terminal of resister 236 is connected to potential source 234 which provides approximately +10 volts. This potential source and resistor combination provides a substantially constant current source to the tunnel diode 228. (The sources 234 and 224 in combination with resistors 236 and 226 respectively, are effective to define the bias current $I_B$ which is applied to tunnel diode 228.) The cathode of backward diode 230 is connected to the common junction 244. The anode of the backward diode which may also be a GE type ZJ722 diode is connected to the potential source 232 which may be ground potential. This combination of potential source and backward diode provides a further clamping network which enhances the operation of the circuit.

Also connected to the common junction 244 is the anode of reset diode 216 which may be a Hughes HD5000 diode. The cathode of diode 216 is connected to a switch generally shown at 214. One of the terminals of switch 214 is connected to delay line 210 the delay time of which may be determined as a function of the clock signal repetition rate and another terminal of the switch is connected to reset clock source 212. This configuration is utilized to show that the reset clock pulse which may be supplied to the tunnel diode 228 via reset diode 216 may be supplied by alternate means. Thus, the clock signal supplied by source 208 may be transmitted via delay line 210 and switch 214 (where the switch is so connected) to diode 216 and tunnel diode 228. In the alternative, if the delay line method of supplying reset clock signals is undesirable for any reason, a reset clock source 212 may be connected to diode 216 via switch 214 to supply reset clock signals to tunnel diode 228. The manner in which the reset clock signals are supplied to the tunnel diode 228 is relatively immaterial and the operation of the circuit is similar so long as the signals are supplied properly. The reset signal (whether supplied by source 212 or by delay line 210) is characterized by a positive potential base-line on the order of +500 millivolts and a negative-going signal on the order of −500 to −1000 millivolts. Moreover, it is desirable that the reset signal be applied as nearly as possible, timewise, to the set clock signal but preceding the set clock signal whereby the tunnel diode will be assured to be in the low voltage operating condition when the clock signal is supplied.

It is to be understood of course, that the particular designations for the components shown in the embodiments of FIGURE 2 are exemplary only. That is, the values of the resistors, the potentials, etc., may be changed in accordance with a modification of the type of nonlinear components which may be desired. That is, if the current carrying capacity of the tunnel diode is increased or decreased, the value of the potentials supplied by the sources as well as the value of the impedances associated therewith may be required to be changed in order to provide a workable bias current, or the like. Consequently, it is to be understood that the invention is not to be limited by the illustrative values and components discussed.

Figure 3:
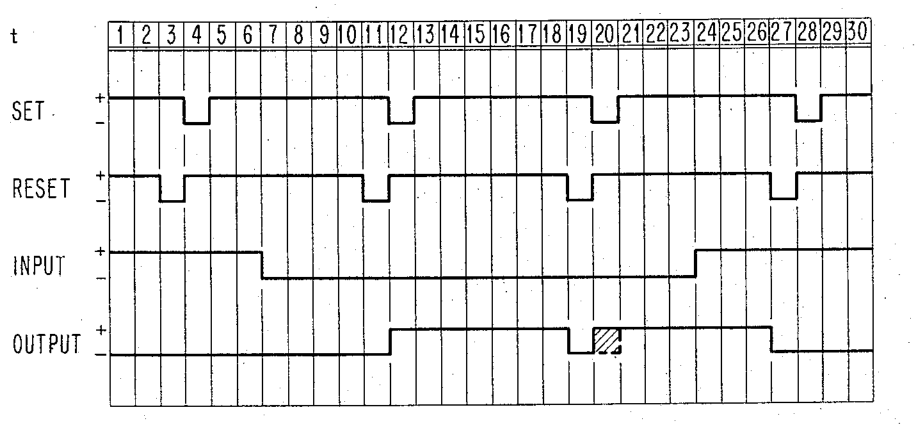
FIGURE 3 shows an idealized timing diagram for the embodiments shown in FIGURES 2 and 4.

The operation of the circuit shown in FIGURE 2 is more readily understandable when considered in the light of the timing diagram shown in FIGURE 3. In the steady state operation the potential sources 234 and 224 in conjunction with resistors 236 and 226 respectively, provide a substantially constant current source to tunnel diode 228. Thus, tunnel diode 228 is biased to the operating point shown in FIGURE 1 and defined by the current $I_B$ which may be on the order of 15 milliamperes. Moreover, tunnel diode 228 is effectively floating with respect to ground such that the potential at the anode thereof is $\pm V_1/2$ and the potential at the cathode thereof is $-V_1/2$. The values may be defined as approximately 25 millivolts, for example. It will be seen that this steady state current exists inasmuch as the backward diode 220 and 230 are effectively back-biased and high impedances relative to resistors 236 and 226 and pass little or no current therethrough. Similarly, the signal supplied by clock source 208 is normally a relatively high potential (+500 millivolts) which is applied via diode 202 to the cathode of backward diode 218 whereby said backward diode is effectively back-biased and cannot pass current therethrough. Similarly, the reset clock signal (regardless of the manner of presentation) is generally a high level signal (+500 millivolts) which back-biases reset diode 216 whereby current cannot flow therethrough. Moreover current will not be drawn through the outputs 238 (assuming a plurality of further stages, similar to that shown in FIGURE 2, are connected to the outputs 238 via diodes similar to those shown as input diodes 200). That is, the application of the high level base clock signal back-biases the diodes 200 (also the diodes connected to output terminals 238) whereby output current cannot be drawn.

Referring to the particular timing arrangement shown in FIGURE 3, set and reset signals are high level signals at time periods *t*1 and *t*2, the high level signal may be defined as on the order of +500 millivolts. Similarly, the input signal is a high level signal, as about +500 millivolts. It is assumed that the tunnel diode 228 was previously reset to the low voltage operating condition. The high level signal supplied to diode 202 via clock source 208 will effectively cancel the input signals applied to any of the input diodes 200. That is, the high level clock signal is on the order of +500 millivolts. The input signal supplied to diodes 200 is on the order of+ 500 millivolts. Diodes 200 have an inherent voltage drop of about 250 to 350 millivolts thereacross. Consequently, the potential at common junction 240 will be on the order of +150 millivolts. The potential drop across resistor 204 between source 206 and common junction 240 produces a current therethrough which current is denoted as $I_{R1}$ and is on the order of 4 milliamps. (This current will be more thoroughly described subsequently.) The +150 millivolt potential at common junction 240 is also effective to back-bias backward diode 218 in view of the fact that common junction 242 resides at about −25 millivolts as discussed supra. Therefore, the high level input signal applied to input diode 200 is ineffective to cause any change in the output signal produced by tunnel diode 228.

At the time period *t*3, a negative-going reset signal is supplied to the circuit. This signal which was at about +500 millivolts at the base level, switches to approximately −500 millivolts when the pulse is being supplied. This negative-going pulse tends to forward bias reset diode 216. Therefore, current will tend to flow through diode 216 to the source which is supplying the reset clock signals whether it be source 212 or source 208 via delay line 210. The drawing of current through diode 216 would normally have the effect of drawing current from tunnel diode 228. However, the potential difference produced across backward diode 220 is insufficient to permit a significant current flow. Likewise, current flow from sources 234 or 224 is not feasible inasmuch as these sources are substantially constant current sources. Thus, it may be seen that current will be drawn from source 232 (which is on the order of ground potential) via backward diode 230 which will now be forward biased and operate as a clamp circuit. Thus it will be seen that the potential at the anode of tunnel diode 228 is virtually stationary and little or no output change is detectable.

With the application of a negative going set clock signal by source 208 at time period *t*4, the diode 202 is reverse biased. The current which had previously been supplied to the constant current source comprising source 206 and resistor 204 by source 208 via diode 202 is now turned off. Consequently, the constant current source must obtain current from another network. Inasmuch as the input signal is still a high level signal, the common junction 240 still resides at approximately +150 millivolts whereby backward diode 218 is reverse biased as noted supra. Consequently, it will be seen that the current required by the constant current source will be obtained via input diode 200. Again, it will be seen that no change has been effected in the operating condition of tunnel diode 228 inasmuch as reverse-biased backward diode 218 has effectively isolated the tunnel diode circuit from the input circuit.

At time period *t*7, the input signal which is an arbitrarily selected signal switches from the high to the low level. The low level signal may be considered to be approximately +50 millivolts inasmuch as it has been assumed that the input is being supplied by a preceding tunnel diode circuit.

The application of the reset clock signal at time period *t*11 functions as before and inasmuch as the tunnel diode was not switched previously it is not switched to, but rather is maintained in, the low voltage operating condition. Now, at the application of the negative-going set clock signal via source 208 at time period *t*12, a different operation occurs. That is, the negative-going set clock signal reverse biases the set diode 202, effectively making that diode an open circuit. The input signal supplied to the input diodes 200 is on the order of +50 millivolts. Inasmuch as the diodes 200 have an inherent voltage drop thereacross of 250 to 350 millivolts, common junction 240 exhibits a maximum potential thereat of approximately −200 millivolts. A review of the fact that common junction 242, the anode of backward diode 218, has thereat a potential of about −25 millivolts, suggests that the backward diode 218 is rendered forward biased and highly conductive. Thus, the constant current $I_{R1}$ which must be supplied to the constant current source comprising potential source 206 and resistor 204, must flow through diode 218 inasmuch as diodes 200 and 202 are reverse-biased. Clearly, this current must be passed through tunnel diode 228 from source 232 via backward diode 230. That is, when the set clock signal goes to −500 millivolts, common junction 240 exhibits a potential of about −300 millivolts whereupon backward diode 218 is rendered conductive. Common junction 242 is then clamped at about −100 millivolts by source 222 via backward diode 220. Since tunnel diode 228 has a 50 millivolt drop thereacross junction 244 drops from about +25 millivolts toward about −50 millivolts. Thus, backward diode 230 is rendered forward biased and conductive and the current through tunnel diode 228 is increased whereby the tunnel diode 228 is switched from the low to the high voltage operating condition. Thus it is shown in FIGURE 3 that, at time period *t*12, the output signal supplied at the anode of tunnel diode 228 is raised to the high level output signal. Inasmuch as this signal is on the order of +400 millivolts, backward diode 230 is cut off and the current through tunnel diode 228 is supplied by source 224 and 234.

At time period *t*19, the reset clock signal is supplied to the circuit. This negative going signal operates as discussed supra and forward biases the reset diode 216 whereby current is drawn therethrough. Inasmuch as the anode of tunnel diode 228 becomes effectively clamped to approximately ground potential via backward diode 230, the tunnel diode is switched back to the low voltage operating condition. It is to be understood that the tunnel diode is switched when the potential thereacross falls below the $V_V$ potential, and the anode of the tunnel diode need not be actually grounded. The switching of the output signal is shown at time period *t*19 in FIGURE 3. The application of the set clock signal at time period *t*20 operates as discussed supra with relation to the set clock signal via the time period *t*12 and causes the tunnel diode 228 to switch to the high voltage operating condition.

At time period *t*24, the input signal arbitrarily is shown to switch to the high level. The output signal, however, remains at the high level until the application of the reset signal at time period *t*27. At that time, the reset signal again causes tunnel diode 228 to switch from the high back to the low voltage operating condition. Inasmuch as the input signal is a high level signal when the set clock signal is applied at *t*28, the tunnel diode 228 is not switched to the high voltage operating condition. This may be shown as identical operation to that discussed relative to time period *t*4.

The clamping network, comprising source 222 and backward diode 220, are used primarily when the outputs 238 are being sampled by the application of a clock pulse to the succeeding network. Thus, source 222 may be approximately −100 millivolts. This potential is applied to the common junction 242 via backward diode 220 when the backward diode is forward biased and effectively clamps the junction to −100 to −150 millivolts. The operation is more readily understandable when it is considered that a clock pulse to a succeeding network is supplied by a source similar to source 208. Input diodes similar to input diodes 200 are connected to the output terminals 238. When a clock signal is supplied to the succeeding network, current is drawn from the instant circuit by the diodes connected to the output terminals. Normally, this current drain would tend to reduce the amount of current flowing through tunnel diode 228 thereby reducing the potential at the anode of the tunnel diodes. That is, the current supplied by source 234 and resistor 236 would divide between tunnel diode 228 and the outputs 238. If, however, the source 222 is connected to the cathode of the tunnel diode 228 via backward diode 220, the cathode of tunnel diode 228 is effectively clamped at a value of about −150 millivolts. That is when backward diode 220 becomes forward biased by a potential drop at the cathode of the tunnel diode, additional current is supplied from source 222. This current is defined to be $I_{R1}$ or equivalent to the load current drawn by an input circuit. When the cathode of the tunnel diode 228 is clamped at −150 millivolts, the anode is effectively clamped at +250 millivolts. Thus, inasmuch as the cathode of the tunnel diode is effectivley clamped, the output potential and current developed thereby is maximized. That is, since the tunnel diode is not free to float up and down with respect to ground, the entire high level potential $V_H$ and the high level current $I_H$ (see FIGURE 1) are made available to the output circuits.

The operation of the circuit shown in FIGURE 2 has been shown to perform the logic NOR function. That is, with the application of an input signal (which may be defined as a high level input signal) no output signal (which may be defined as a low level output signal) is produced. In the alternative, when no input signal or a low level input signal is supplied, a high level output signal is produced. Modifications may be made to the circuit shown in FIGURE 2 (and other figures as well) wherein the input signals may be supplied to the anode of the tunnel diode and the output signals detected at the cathode. These modifications pertain generally to signal polarity and the like but the inventive concept is not materially different.

Figure 4:
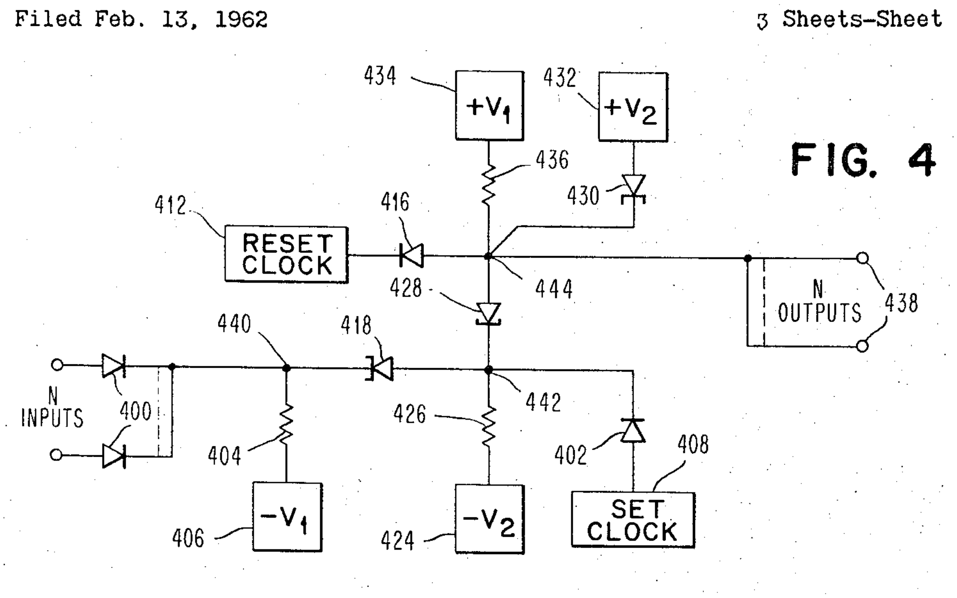
FIGURE 4 is a schematic diagram of another embodiment of this invention.

Referring now to FIGURE 4, there is shown another embodiment of the invention which is similar to the embodiment shown in FIGURE 2 but which incorporates certail additional circuitry advantages. In FIGURE 4, components which are similar to components in FIGURE 2 are labeled with reference numerals having the same last two digits as those in FIGURE 2. Thus, for example, tunnel diode 428 in FIGURE 4 is similar to tunnel diode 228 shown in FIGURE 2. The basic difference between the two embodiments is the circuit location at which the set clock pulse signal is applied to the circuit. That is, in the embodiment shown in FIGURE 4, the set clock source 408 is connected to the anode of set diode 402 which has the cathode thereof connected to the common junction 442 rather than common junction 440. The other circuit components are the same as those previously described in FIGURE 2, with the exception of clock source 408 which may have a base-line potential of about +300 millivolts and a negative signal of about −200 millivolts. This clock source arrangement has the effect of clamping the cathode of tunnel diode 428 to a higher potential. It will be seen that by clamping the common junction 442 (the cathode of tunnel diode 428) to a higher potential, the anode of tunnel diode 428 is effectively clamped at a higher output potential (for example +800 millivolts) whereby more outputs may be provided. That is, the fan-out of M outputs in the embodiment shown in FIGURE 4 may be substantially increased over the fan-out of M outputs in FIGURE 2. It is to be understood that the alternative methods of applying reset clock signal to reset diode 416 are equally applicable in the embodiment shown in FIGURE 4.

The operation of the embodiment shown in FIGURE 4 is identical to the operation shown in the timing diagram of FIGURE 3. That is, with the application of a clock signal by source 408, the tunnel diode 428 may or may not be switched depending upon the input signal supplied thereto. Referring to the timing diagram in FIGURE 3, it is assumed that the tunnel diode 428 is initially reset to the low voltage operating condition whereby the output signal supplied during time periods *t*1 and *t*2 are low level signals. In addition, the arbitrary input signal applied to input diodes 400 is assumed to be a high level input signal. The application of the reset clock signal in time period *t*3 is ineffective to produce any net change in the output signal inasmuch as the tunnel diode was already in the low voltage operating condition.

That this may be shown, it is assumed that the input signal is on the order of +500 millivolts and the potential at common junction 440 will be on the order of +150 millivolts due to the forward voltage drop across diodes 400. Likewise, the normal base potential for the clock signal is +300 millivolts and common junction 442 will be on the order of ground potential and the potential at common junction 444 will be on the order of +50 millivolts. Consequently, backward diodes 418 and 430 will be effectively back-biased and cut-off whereby the current supplied to the constant current source comprising source 406 and resistor 404 is supplied only via input diode 400. Moreover, when the set clock signal goes to the low level, on the order of about −200 millivolts, the potential at junction 442 will attempt to follow the set clock signal. However, inasmuch as backward diodes 418 and 430 are back-biased no current flows therethrough. Therefore, the circuit seeks the initial condition described supra (viz symmetrical with respect to ground potential). Thus, the potential value at junction 442 is about −25 millivolts and diode 402 is effectively back biased. Therefore, no change takes place in the tunnel diode 428 circuit.

When the next set clock signal is applied at time period *t*12 it will be seen that the input signal has been switched to the low level (about +50 millivolts for example) at time period *t*7. Thus, the potential at common junction 440 is on the order of −300 millivolts. When the set clock signal supplied by source 408 goes to the −200 millivolt level, diode 402 is cut-off as described supra and junction 442 exhibits a potential of about −100 millivolts. It will be seen that backward diode 418 is forward biased and current flows therethrough. This current flows to the constant current source comprising potential source 406 and resistor 404. Previously, as for example at time period *t*7 through time period *t*11, i.e., the time between the termination of the input signal and the application of the reset signal, current may be considered to have been supplied to source 406 via diode 402 from source 408 which was at the +500 millivolt level. However, when the set clock signal renders diode 402 cut-off, the current must still be supplied to the constant current source. This current which is supplied to the constant current source is now provided via tunnel diode 428. Moreover, the tunnel diode 428 is switched to the high voltage condition by the passage of this current therethrough to the constant current source.

With the application of the reset signal at time period *t*19 the output signal switches to the low level. Furthermore, with the application of the clock signal at time period *t*20 in conjunction with a low level input signal, the output signal switches to the high level. This operation is similar to the operation described in terms of the signal supplied at time period *t*12. The reset signal applied at time period *t*27 again resets the output signal to the low level. The application of a clock signal at time period *t*28 is not effective to switch the output signal to a high level inasmuch as the input signal is a high level signal.

Thus, it will be seen that the circuits shown in FIGURES 2 and 4 are similar in configuration and in operation. That is, with the application of a high level input signal, a low level output signal is provided; and with the application of a low level input signal, a high level output signal is provided in response to the application of a set clock signal. This type of operation provides typical logic NOR circuit operation.

Figure 5:
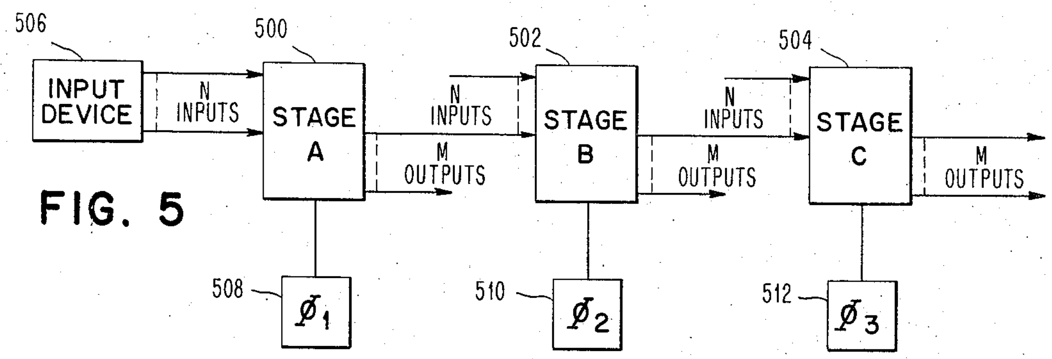
FIGURE 5 is a schematic diagram in block form of another embodiment of this invention.

Referring now to FIGURE 5, there is shown a block diagram of a system utilizing a plurality of circuits as shown in either of FIGURES 2 or 4. That is, stages A, B and C represented as blocks 500, 502 and 504 respectively, each comprise a circuit as shown in FIGURE 2 or 4. The embodiment shown in FIGURE 5 illustrates a plurality of the individual circuits cascaded to form a logic system. The stages 500, 502 and 504 are driven by clock sources 508, 510, and 512 respectively, each of which is similar to those previously described and each of which is shown as being out of phase with the others. The operation of the individual circuits within each of the stages is identical to that previously described.

Figure 6:
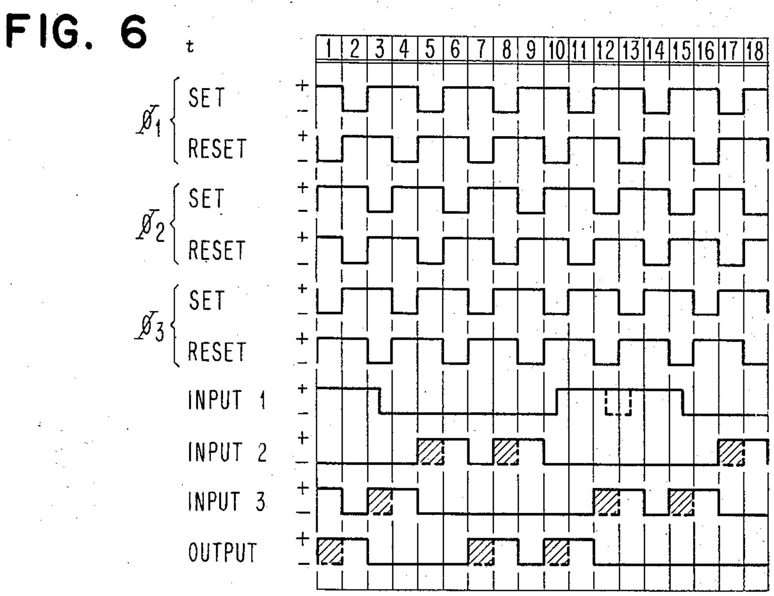
FIGURE 6 is a timing diagram for the cricuit shown in FIGURE 5.

The operation of the system shown in FIGURE 5 is more readily understandable when described in conjunction with the timing diagram shown in FIGURE 6. As a matter of introduction and description, the dashed signal at time period *t*13 for example indicates that the arbitrary input signal may be a pure level signal or may be a pulse type signal with no alteration of circuit operation. The cross-hatched signals, as for example at time period *t*5 in the Input 1 signal, delineate the distinction between the ideal output signal which occurs simultaneously with the clock signal and the actual output signal which occurs sometime thereafter. In fact, the output signal may be indeterminate at the time during the application of a set clock signal. In FIGURE 6, the Input 1 signal is an arbitrary input signal which is supplied by the input device 506. For clarity, the input device for the system is shown as a single unit but it is to be understood that the input device 506 may, in actuality, represent a plurality of separate and distinct input circuits. However, the input signal is applied to stage A via input diodes, which are included within the block 500. Likewise, the $\phi 1$ clock signals are supplied to stage A by clock source 508. The signal which is denoted Input 2 is also the output signal supplied by stage A. Thus, it will be seen that the input signal is a low level signal at time period *t*1. This signal would be low level in any event inasmuch as stage A has been reset by a reset signal during time period *t*1. At time period *t*2, the $\phi 1$ set clock signal is applied in conjunction with a high level input signal to stage A. As previously described, this combination of signals will render a low level output signal from stage A. At time period *t*5, it will be seen that the $\phi 1$ set clock signal is applied to stage A in conjunction with a low level Input 1 signal. This combination of signals in the circuit has been shown to produce a high level output signal. The high level signal continues until the circuit is reset by the reset clock signal at time period *t*7. Inasmuch as the set clock signal at time period *t*8 is applied in conjunction with a low level Input 1 signal, the output signal produced by the circuit is again a high level signal. This signal remains at the high level until the circuit is reset by the reset signal at time period *t*10. The clock signals applied to stage A at time periods *t*11 and *t*14 are applied in conjunction with a high level Input 1 signal. As discussed supra, this combination of signals will produce a low level output signal from stage A. Once again, the set clock signal at time period *t*17 is applied in conjunction with a low level Input 1 signal whereupon the output signal from stage A is a high level signal and remains such until reset.

Thus it will be seen that stage A operates as a NOR circuit inasmuch as high level output signals are produced only in the presence of low level input signals, and vice versa.

The operation of stage B is similar to that of stage A. That is the Input 2 signal is applied to one of the N inputs of stage B represented by box 502. The $\phi 2$ clock signals are applied to stage B by clock source 510. The output which is applied to one of the output terminals of the stage B is an input to stage C and is designated as Input 3 in FIGURE 6. The output signal derived from stage B is assumed to be a high level signal at time period *t*1. (This signal level is not critical to the description and is dependent upon the preceding signals applied.) At time period *t*2, the output signal from stage B is clearly a low level signal inasmuch as a $\phi 2$ reset signal is supplied at that time. The $\phi 2$ set clock signal applied at time period *t*3 is applied in conjunction with a low level Input 2 signal whereby the output signal from stage B is a high level signal.

The set clock signal supplied to stage B at time period *t*3 is applied thereto in conjunction with a low level Input 2 signal whereupon the output signal from stage B is a high level signal. This high level signal remains such until reset by the application of a $\phi 2$ reset signal at time period *t*5. A clock signal applied at time period *t*6 is supplied in conjunction with a high level Input 2 signal whereupon the output signal supplied by stage B is a low level signal. The low level signal remains as such, even during the application of a set clock signal at time period *t*9, inasmuch as the input 2 signal supplied to stage B is a high level signal at that time. At time period $t12$, however, the set clock signal supplied to stage B is applied in conjunction with a low level Input 2 signal. At that time the output signal from stage B becomes a high level signal and remains such until reset by the application of the reset clock signal to stage B at time period $t14$. At time period $t14$, the output signal switches to a low level signal. However, the application of the set clock signal at time period $t15$ is in conjunction with a low level input signal at that time whereupon the output signal of stage B which switches to the high level signal and remains such until reset by the application of a reset signal to stage B at time period $t17$. At time period $t17$ the output signal from stage B switches back to the low level signal. Here again, it is seen that stage B provides NOR logic operation inasmuch as a high level signal is produced at the output thereof in response to a low level input signal and vice versa.

Finally, stage C, represented by block 504, is similar in operation to each of the preceding stages. That is, the inputs are supplied by the N input terminals and the outputs are supplied at the M output terminals. Also, the $\phi 3$ clock signals are supplied by clock source 512. The signal shown in FIGURE 6 and designated Input 3 is the input signal to stage C. The output signal of FIGURE 6 represents the signal produced by stage C. The set clock signal applied to stage C at time period $t1$ is supplied thereto in conjunction with a high level Input 3 signal. Consequently, the output signal is a low level signal and remains such during the application of a reset signal to stage C at time period $t3$. The next succeeding clock signal at time period $t4$ is applied to stage C in conjunction with a high level Input 3 signal. As discussed supra, the output signal remains a low level signal.

The set clock signal applied to the circuit at time period $t7$ is applied in conjunction with a low level Input 3 signal whereupon the output signal of stage C switches to the high level. The output signal remains at the high level until reset to the low level signal by the application of a reset clock signal at time period $t9$. At time period $t10$ another clock signal is applied to the circuit in conjunction with a low level input signal whereupon the output signal switches to a high level signal. The high level signal remains as such until reset to the low level signal by the application of reset signal to stage C at time period $t12$. At time periods $t13$ and $t16$, the set clock signals applied to stage C are applied in conjunction with high level input signals whereupon the output signals supplied by stage C remain low level signals. Again, stage C has operated as a NOR circuit inasmuch as high level output signals are produced in response to low level inputs and clock signals and low level outputs are produced in response to high level input signals at the clock signal times.

Thus, by the description of FIGURES 5 and 6 it may be seen that the individual circuits as shown in FIGURES 2 and 4 may be cascaded to form a logic system network. It is to be understood of course, that the timing of the clock pulses supplied to the various stages may be modified somewhat insofar as the succeeding reset clock signal need not overlap the preceding set clock signal in two adjacent stages. However, the timing diagram shown in FIGURE 6 is an illustration of one type of operation. Moreover, it is to be understood that a description of FIGURES 5 and 6 is on the basis of a one to one input and output arrangement. That is, the input signal to stage B for example is shown as being only identical to the output signal supplied by stage A. Clearly this is merely an example inasmuch as N inputs are supplied to stage B. (Moreover, other circuit stages may be interconnected with those shown.) However, the particular clocking arrangements and signal arrangements are shown for purposes of illustration only and the application of a high level input at all times would be fruitless as would be the application of a low level input at all times. Thus the mode of operation and illustrative example shown in FIGURES 5 and 6 is one of the arrangements which are contemplated for this system as well as for the individual circuits, some modifications of which have already been described. It is manifestly clear that the illustrative examples given here are not to be limitative of the invention but rather the scope of the invention is to be limited only by the appended claims.

Having thus described the invention what is claimed is:

1. In combination, a tunnel diode having two stable operating states, said tunnel diode exhibiting different potential drops thereacross in each of said stable states, said tunnel diode having an anode and a cathode, input means comprising a plurality of diodes connected together to form a logic network for providing input signals having different levels, a first backward diode connected between said input means and the cathode of said tunnel diode, a current sink connected to said input means and said first backward diode, said first backward diode so poled that conventional current may flow therethrough from said tunnel diode to said current sink, a source of periodic pulses connected to said input means, said current sink and said first backward diode, said source providing current to said current sink to reverse bias said first backward diode except during the application of said periodic pulses, said input means providing current to said current sink to reverse bias said first backward diode when one input signal level is applied, bias means connected to said tunnel diode for biasing said tunnel diode to one of said stable states, a current source, a second backward diode connected between said current source and said anode of said tunnel diode, said current source providing current flow through said tunnel diode to said current sink only when said first backward diode is forward biased such that said tunnel diode switches from said one stable state to the other stable state, a potential source, a third backward diode connected between said potential source and said cathode of said tunnel diode, output means connected to said anode of said tunnel diode for providing different output signals in accordance with different stable states of said tunnel diode, said potential source and said third backward diode providing a clamping network such that said output means provides accurate output signals, and reset means connected to said tunnel diode for switching said tunnel diode from said other stable state to said one stable state.

2. In combination, a tunnel diode having two stable operating states, said tunnel diode exhibiting different potential drops thereacross in each of said stable states, said tunnel diode having two electrodes, input means comprising a logic network for providing input signals having different levels, a backward diode connected between said input means and one electrode of said tunnel diode, a current sink connected to said input means and said backward diode, a source of periodic pulses connected to said input means and said current sink and said backward diode, said source providing current to said current sink to reverse bias said backward diode except during the application of said periodic pulses, said input means providing current to said current sink to reverse bias said backward diode when one input signal level is applied, bias means connected to said tunnel diode such that said tunnel diode is floating relative to ground potential and for biasing said tunnel diode to one of said stable states, a current source connected to one electrode of said tunnel diode, said current source providing current flow through said tunnel diode to said current sink via said backward diode only when said backward diode is forward biased such that said tunnel diode switches from said one stable state to the other stable state, a potential source connected to the other electrode of said tunnel diode to provide a clamping network to prevent said output means from inadvertently switching the stable state of said tunnel diode, output means connected to one electrode of said tunnel diode for providing different output signals in accordance with the different stable states of said tunnel diode, and reset means connected to said tunnel diode for switching said tunnel diode from said other stable state to said one stable state.

References Cited by the Examiner

UNITED STATES PATENTS

| | | | |
|---|---|---|---|
| 2,903,606 | 9/1959 | Curtis | 307—88.5 |
| 2,918,587 | 12/1959 | Rector et al. | 307—88.5 |
| 2,944,164 | 7/1960 | Odell et al. | 307—88.5 |
| 3,054,002 | 9/1962 | Tendick | 307—88.5 |
| 3,097,312 | 7/1963 | Miller | 307—88.5 |
| 3,112,413 | 11/1963 | Zimbel | 307—88.5 |
| 3,142,768 | 7/1964 | Kaufman | 307—88.5 |
| 3,182,204 | 5/1965 | Galletti | 307—88.5 |
| 3,194,981 | 7/1965 | Cubert | 307—88.5 |
| 3,205,371 | 9/1965 | Slobodzinski | 307—88.5 |
| 3,209,163 | 9/1965 | Wendt | 307—88.5 |
| 3,221,180 | 11/1965 | Kaufman | 307—88.5 |

ARTHUR GAUSS, *Primary Examiner.*

J. JORDAN, *Assistant Examiner.*